United States Patent [19]
Lee

[11] Patent Number: 6,111,798
[45] Date of Patent: Aug. 29, 2000

[54] FUSE REPAIR CIRCUIT FOR SEMICONDUCTOR MEMORY CIRCUIT

[75] Inventor: Joo Sang Lee, Seoul, Rep. of Korea

[73] Assignee: LG Semicon Co., Ltd., Cheongju, Rep. of Korea

[21] Appl. No.: 09/247,523

[22] Filed: Feb. 10, 1999

[30] Foreign Application Priority Data

Nov. 2, 1998 [KR] Rep. of Korea .................. 98-3986

[51] Int. Cl.⁷ ..................................................... G11C 7/00
[52] U.S. Cl. ........................................ 365/200; 365/225.7
[58] Field of Search ................................... 365/200, 201, 365/185.09, 225.7

[56] References Cited

U.S. PATENT DOCUMENTS

| | | | |
|---|---|---|---|
| 5,383,156 | 1/1995 | Komatsu | 365/200 |
| 5,559,741 | 9/1996 | Sobue | 365/200 |
| 5,652,725 | 7/1997 | Suma et al. | 365/200 |
| 5,771,195 | 6/1998 | McClure | 365/200 |
| 5,781,486 | 7/1998 | Merrit | 365/200 |
| 5,808,948 | 8/1998 | Kim et al. | 365/200 |

*Primary Examiner*—Tan T. Nguyen

[57] ABSTRACT

A fuse repair circuit for a semiconductor memory device includes a cell array provided with a row redundancy and a column redundancy and a fuse block for driving the row redundancy during a RAS cycle and driving the column redundancy during a CAS cycle, wherein the fuse block consists of an address input unit for selectively outputting a row address or a column address in accordance with switching signals, a plurality of fuse units, wherein redundancy information of a defective cell is programmed, for comparing an inputted address with the programmed redundancy information, and a redundancy driving unit for outputting a matching signal for driving the row redundancy or the column redundancy when the inputted address and the programmed redundancy information are identical.

18 Claims, 4 Drawing Sheets

FUSE REPAIR CIRCUIT FOR SEMICONDUCTOR MEMORY CIRCUIT

BACKGROUND OF THE INVENTION

1. Field of the Invention

The present invention relates to a semiconductor memory device, and more particularly to a fuse repair circuit for a semiconductor memory device.

2. Description of the Conventional Art

If there is a defective cell among numerous minute cells, a memory is not able to perform its function properly, thus being handled as an inferior memory. However, as the memory has been more integrated, there is high probability that defect is generated in a small amount of cells, but to regard a whole memory which has a little defect as the defective memory is not an effective way, which reduces the yield. Thus, generally a redundancy cell is provided in a semiconductor memory and when a cell has defect, the bad cell is repaired by using a reserved redundancy cell, for thereby increasing the yield. In such configuration, a fuse repair circuit is programmed with address information regarding a row redundancy and a column redundancy and then a bad cell is repaired by using the reserved redundancy cell when an inputted address (a column address or a row address) accords with the programmed address information. FIG. 1 illustrates a conventional fuse repair circuit of a semiconductor memory in a block diagram form. As shown therein, the conventional fuse repair circuit is provided with a cell array 10, a row fuse block 20 and a column fuse block 30, the row fuse block 20 and the column fuse block 30 driving a row redundancy 50 and a column redundancy 51, respectively, of the cell array 10. The row fuse block 20 outputs a matching signal MATR at a high level when receiving a row address RA identical to programmed row redundancy information, while the column fuse block 30 outputs a matching signal MATC at a high level when receiving a column address CA identical to programmed column redundancy information.

FIG. 2 shows the row fuse block 20 in more detail. More specifically, the row fuse block 20 includes a plurality of fuse units 101–104 for programming row redundancy information to be repaired and comparing the programmed row redundancy information with an inputted row address, and a NOR gate 105 for outputting the matching signal MATR for enabling the row redundancy 50 by NORing compare signals A–D from the fuse units 101–104. Here, the number of the fuse units 101–104 is varied by the number of bits of the row address RA. Further, each of the fuse units 101–104 includes PMOS transistors PM1, PM2 connected in parallel between a source voltage Vcc and a node P, a fuse F1 connected between the node P and a ground voltage Vss, an inverter INV1 connected between the node P and a gate of the PMOS transistor PM2, and an exclusive-OR gate EXOR comparing the row address with an output from the inverter INV1, wherein a precharge signal PRECH is inputted to a gate of the PMOS gate PM1. Here, a power-up signal is used for the precharge signal PRECH in the row block 20 and the power-up signal or a row address strobe (RAS)-system signal is used for the precharge signal PRECH in the column fuse block 30.

The column fuse block 30 has the same construction as the row fuse block 20. However, in the column fuse block 30, column redundancy information is programmed in a fuse F1 of the column fuse block 30, each fuse unit 101–104 compares an inputted column address CA with the programmed column redundancy information, and a NOR gate 105 outputs the matching signal MATR for enabling the column redundancy 51.

In such conventional fuse repair circuit, after fabricating a semiconductor memory, a user tests the memory cells for thereby judging whether or not the cells are in a good condition. Here, when there are many inferior cells, the user abolishes the fabricated memory, but if there is minority of defective cells, the user programs the redundancy information in the row fuse block 20 and the column fuse block 30, respectively, so that redundancy cells can be substituted for the defective cells. That is, the user programs the redundancy information by selectively cutting the fuses F1 in the fuse units 101–104 in accordance with a test result.

For instance, when a cell in an address '1000' is determined to be defective, the user programs redundancy information of '0111' in each of the fuse units 101–104 of the row fuse blocks 20 or the column fuse block 30 so that the defective cell can be repaired by a redundancy cell. Namely, '0111' is programmed on the basis of a potential of the node P thereof by not cutting the fuse F1 of the fuse unit 101, but cutting each fuse F1 of the other fuse units 102–104.

Next, when power is applied, the precharge signal PRECH becomes a high level and thereby the PMOS transistor PM1 of each of the fuse units 101–104 is turned on. When the PMOS transistor PM1 is turned on, each node P is precharged and thus the node P of the fuse unit 101 becomes a low level and all of the nodes P of the other fuse units 102–104 become a high level. Accordingly, the inverters INV1 of the fuse units 101–104 invert respectively the potential of the nodes P, thereby outputting signals of '1000' to the exclusive-OR gates EXOR.

Accordingly, the exclusive-OR gates EXOR of the fuse units 101–104 output the compare signals A–D at the low level when receiving the row address RA of '1000' and the NOR gate 105 NORs the compare signals A–D at the low level and thus outputs the matching signal MATR at the high level, for thereby driving the row redundancy 50. While, during a column address strobe (CAS) cycle, the exclusive-OR gates EXOR output the compare signals A–D when receiving the column address CA of '1000', and the NOR gate 105 NORs the compares signals A–D at the low level and thus outputs the matching signal MATC at the high level, for thereby driving the column redundancy 51.

As described above, since the conventional fuse repair circuit drives the row redundancy and the column redundancy by the row fuse block and the column fuse block, respectively, the fuse repair circuit has a problem of increase in a chip size because the two fuse block which perform the same function are unnecessarily required to be used.

SUMMARY OF THE INVENTION

Accordingly, the present invention is directed to a fuse repair circuit which obviates the problems and disadvantages due to the conventional art.

An object of the present invention is to provide a fuse repair circuit that reduces a chip size by driving a row redundancy and a column redundancy with a single fuse block.

To achieve these and other advantages and in accordance with the purpose of the present invention, as embodied and broadly described, there is provided a fuse repair circuit for a semiconductor memory device which includes a cell array provided with a row redundancy and a column redundancy, and a fuse block for driving the row redundancy during a RAS cycle and the column redundancy during a CAS cycle.

Further, according to the embodiment of the present invention, the fuse repair circuit for the semiconductor memory device includes an address input unit for selectively outputting a row address or a column address in accordance with switching signals, a plurality of fuse units, wherein redundancy information of a defective cell has been programmed, for comparing an inputted address with the programmed redundancy information, and a redundancy driving unit for outputting a matching signal for driving the row redundancy or the column redundancy when the inputted address and the programmed redundancy information are identical.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

Figure 1:
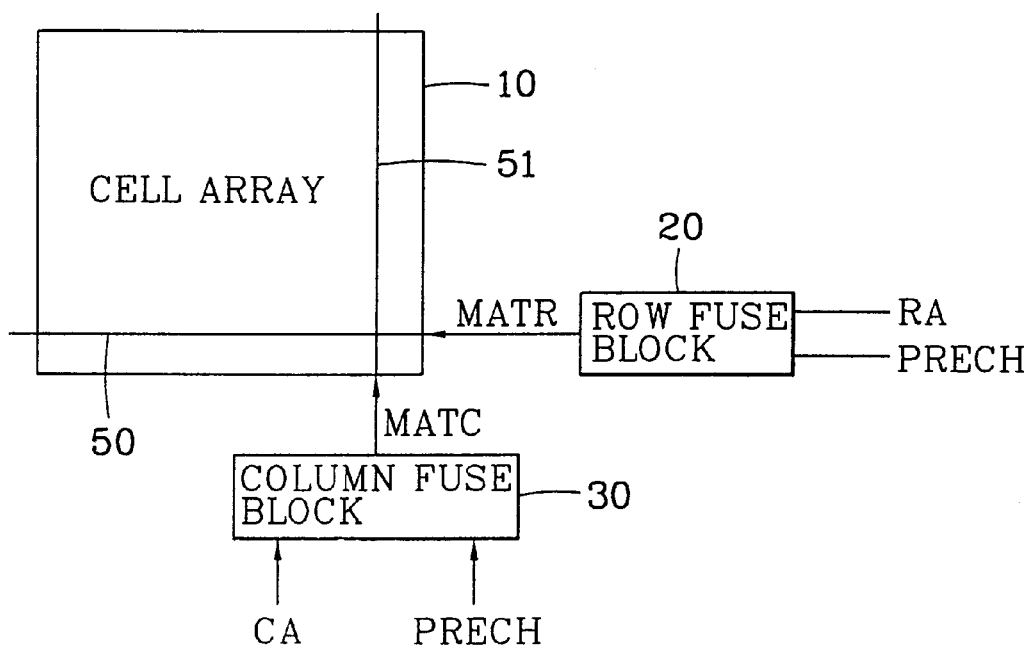
FIG. 1 is a schematic block diagram of a conventional fuse repair circuit.
Figure 2:
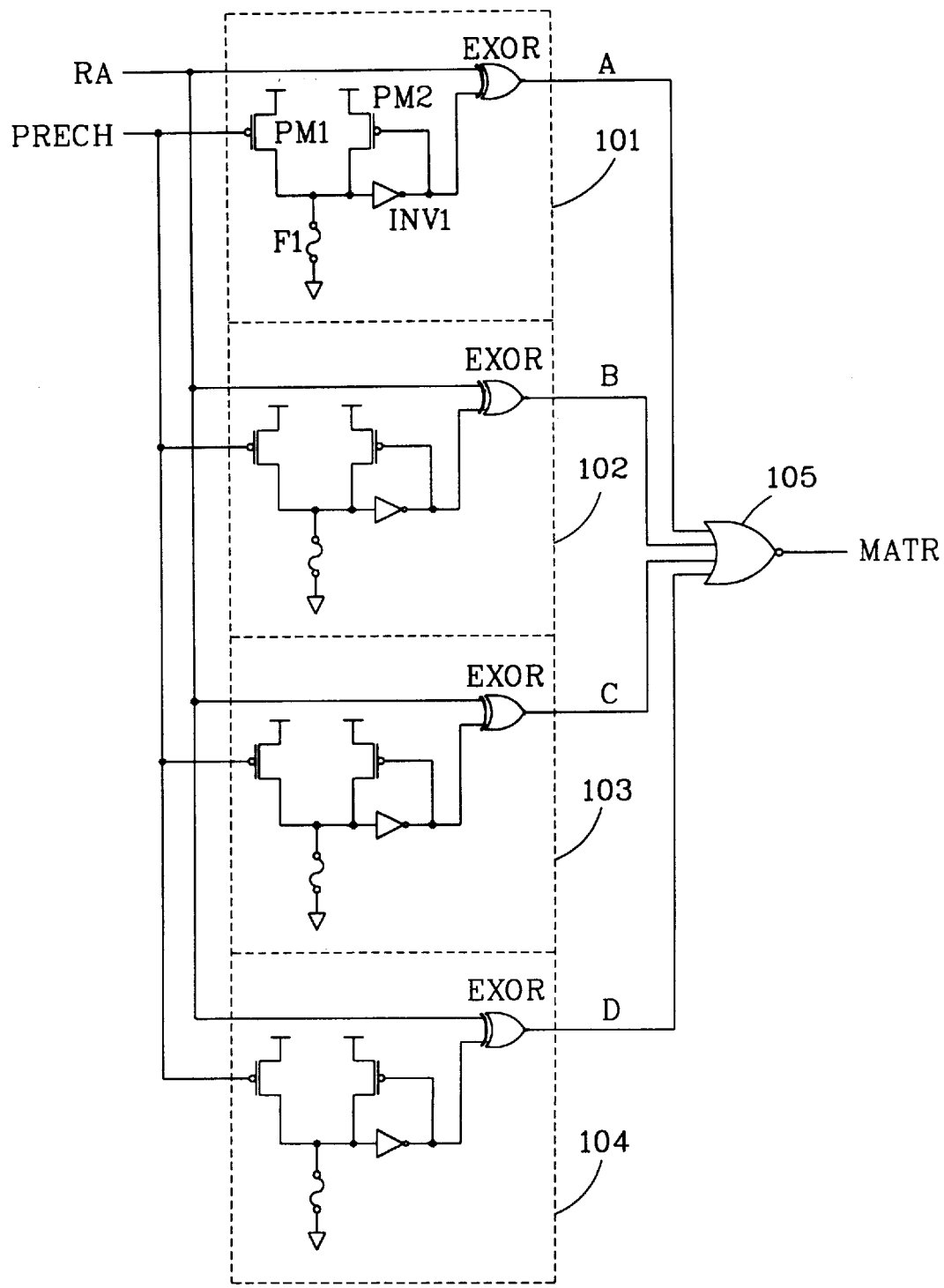
FIG. 2 is a detailed diagram of a low fuse block and a column fuse block in FIG. 1.
Figure 3:
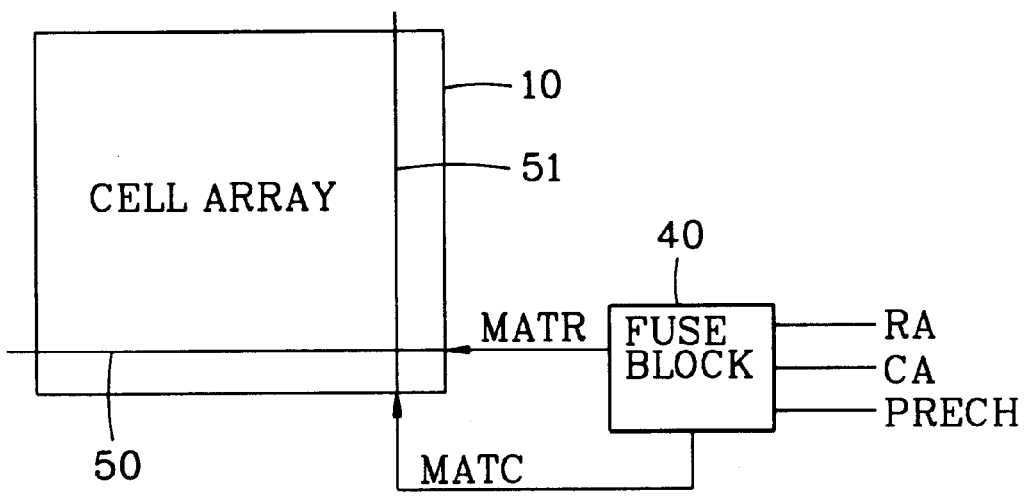
FIG. 3 is a schematic block diagram of a fuse repair circuit according to the present invention.
Figure 4:
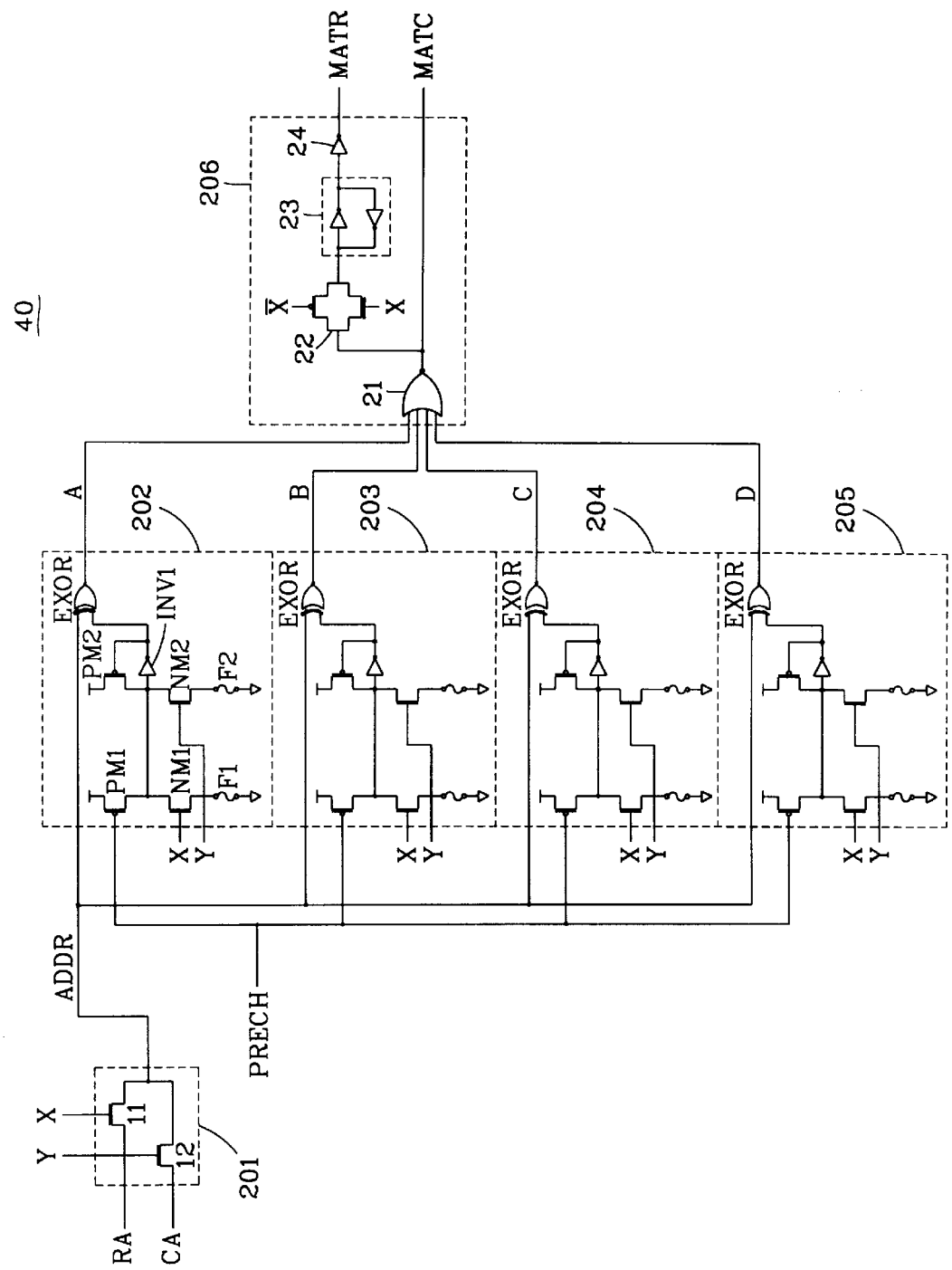
FIG. 4 is a detailed diagram of a fuse block in FIG. 3.

As shown in FIG. 3, a fuse repair circuit is provided with a cell array 10 and a single fuse block 40, the fuse block 40 driving a row redundancy 50 and a column redundancy 51 of the cell array according to an operational cycle that is a RAS or CAS cycle. The fuse block 40, as shown in FIG. 4, consists of an address input unit 201 which outputs a row address RA or a column address CA in accordance with switching signals X, Y, a plurality of fuse units 202–205 that compare an address ADDR which has been inputted through the address input unit 201 with programmed redundancy information and a redundancy driving unit 206 which receives compare signals A–D from the fuse units 202–205 and outputs a matching signal MATR for driving the row redundancy 50 or a matching signal MATC for driving a column redundancy 51, the switching signal X being activated during a predetermined interval after transition of the RAS signal and the switching signal Y being activated during a predetermined interval after transition of the CAS signal.

More specifically, it is noted that the address input unit 201, which is a sort of a multiplexor, consists of NMOS transistors 11, 12 which output a row address and a column address, respectively, in accordance with the switching signals X, Y. The fuse units 202–205 have the same configuration, and the number of the fuse units is varied in accordance with the number of bits of an address, each of the fuse units 202–205 consisting of PMOS transistors PM1, PM2 connected in parallel between a source voltage Vcc and a node P, a NMOS transistor NM1 and a first fuse F1 serially connected between the node P and ground Vss, a NMOS transistor NM2 and a second fuse F2 serially connected between the node P and the ground Vss, an inverter INV1 connected between the node P and a gate of the PMOS transistor PM2, and an exclusive-OR gate EXOR which compares an output from the inverter INV1 and an inputted address, the gates of the NMOS transistors NM1, NM2 receiving the switching signals X, Y, respectively, and the first and second fuses F1, F2 being programmed with row redundancy information and column redundancy information, respectively. The redundancy driving unit 206 consists of a NOR gate 21 which NORs the output signals A–D from the fuse units 202–205, a transmission gate 22 which transmits an output from the NOR gate 21 in accordance with switching signals X, /X, a latch 23 which latches an output from the transmission gate 22 and an inverter 24 which inverts an output from the latch 23.

The operation of such fuse repair circuit according to the present invention is as follows.

A user tests a semiconductor memory and programs redundancy information of a defective cell in the fuse block 40 as in the conventional art. In other words, the user selectively cuts the fuses F1, F2 of the fuse units 202–205 and programs the row redundancy information (the row address) and the column redundancy information (the column address), respectively. Accordingly, during the RAS cycle, the fuse block 40 outputs the matching signal MATR at a high level when receiving the row address RA which is identical to the programmed row redundancy information, while during the CAS cycle the fuse block 40 outputs the matching signal MATC at a high level when receiving the column address CA which is identical to the programmed column redundancy information. As a result, the row redundancy 50 and the column redundancy 51 are driven by the matching signals MATR, MATC, respectively, of the high level and thus the defective cell is repaired by the redundancy cell. Next, the above operation will be described in accordance with each operational cycle.

1. RAS cycle

When the RAS signal is transited to a low level, the precharge signal PRECH is activated to the low level and as the precharge signal PRECH becomes the low level, the PMOS transistor PM1 of each of the fuse units 202–205 is turned on and thereby the node P is precharged. After a predetermined time, when the switching signal X is activated to the high level, the NMOS transistor 11 of the address input unit 201 and each NMOS transistor NM11 of the fuse units 202–205 are turned on. Thus, the row address RA is inputted to the fuse units 202–205 through the NMOS transistor 11 which has been turned on, while the potential of each node P which is determined by the fuse F1 which has been cut is inverted in the inverter INV1 and then inputted to the exclusive-OR gate EXOR. Therefore, the exclusive-OR gates EXOR compare outputs from the inverters INV1 with the row address RA, for thereby outputting compare signals A–D to the redundancy driving unit 206. Here, the NOR gate 21 which NORs the compare signals A–D outputs a signal at the high level when all of the compare signals A–D are the low level, that is when the output from the inverter INV1 accords with the row address RA. Accordingly, the output from the NOR gate 21 is inputted through the turned-on transmission gate 22 to the latch 23, a signal which has been latched by the latch 23 is outputted through the inverter 24 during the RAS cycle, and thus the row redundancy 50 is driven by the matching signal MATR at the high level.

2. CAS cycle

On the other hand, when the CAS signal is transited to the low level, the precharge signal PRECH is again activated to the low level, and as the precharge signal PRECH becomes the low level, the PMOS transistor PM1 is turned on and thus the node P is precharged. Next, when the switching signal Y is activated to the high level, the NMOS transistor 12 of the address input unit 201 and the NMOS transistor NM2 of each of the fuse units 202–205 are turned on as previously described. Thus, the column address CA is inputted to the fuse units 202–205 through the NMOS transistor 12 which has been turned on, while the potential of each node P which is determined by the fuse F2 which has been cut is inverted in the inverter INV1 and then inputted to the exclusive-OR gate EXOR. Therefore, the exclusive-OR gates EXOR compare outputs from the inverters INV1 with the column address CA, for thereby outputting compare signals A–D to the redundancy driving unit 206. Here, the NOR gate 21 which NORs the compare signals A–D outputs the matching signal MATC at the high level when all of the compare signals A–D are the low level, that is when the output from the inverter INV1 is identical to the column address CA, for thereby driving the column redundancy 51.

As described above, the fuse repair circuit according to the present invention outputs, during the RAS cycle, the matching signal MATR for the row redundancy 50 by comparing the row address RA with the redundancy information programmed in the fuse F1, while outputs the matching signal MATC for the column redundancy 51 by comparing the column address CA with the redundancy information programmed in the fuse F2 during the CAS cycle.

Accordingly, the fuse repair circuit according to the present invention has an advantage of reducing the chip size by holding the low fuse block and the column fuse block in common with the single fuse ROM array.

It will be apparent to those skilled in the art that various modifications and variations can be made in the fuse repair circuit of the present invention without departing from the spirit or scope of the invention. Thus, it is intended that the present invention cover the modifications and variations of this invention provided they come within the scope of the appended claims and their equivalents.

What is claimed is:

1. A fuse repair circuit for a semiconductor memory device, comprising:
   a cell array including a row redundancy and a column redundancy; and
   a fuse block for driving the row redundancy and the column redundancy in accordance with an operational cycle of the cell array, wherein the fuse block comprises:
   an address input unit for receiving a row address or a column address in accordance with first and second switching signals;
   a plurality of fuse units programmed with redundancy information of a defective cell for comparing an address outputted from the address input unit with the programmed redundancy information; and
   a redundancy driving unit for outputting first and second matching signals by performing a logic operation of signals outputted from the fuse units.

2. The fuse repair circuit for the semiconductor memory device according to claim 1, wherein the first switching signal is activated during a predetermined interval after the transition of a RAS signal and the second switching signal is activated during a predetermined interval after the transition of a CAS signal.

3. The fuse repair circuit for the semiconductor memory device according to claim 3, wherein the address input unit is a multiplexor and consists of a couple of NMOS transistors which output the row address and the column address, respectively, in accordance with the first and second switching signals.

4. The fuse repair circuit for the semiconductor memory device according to claim 1, wherein the first matching signal drives the row redundancy and the second matching signal drives the column redundancy.

5. The fuse repair circuit for the semiconductor memory device according to claim 1, wherein the programmed redundancy information is a row address or a column address of the defective cell.

6. The fuse repair circuit for the semiconductor memory device according to claim 1, wherein each of the fuse units comprises:
   first and second PMOS transistors which are connected in parallel between a source voltage and a first node;
   a first NMOS transistor and a first fuse which are serially connected between the first node and ground;
   a second NMOS transistor and a second fuse which are serially connected between the first node and the ground;
   an inverter connected between the first node and a gate of the second PMOS transistor; and
   an exclusive-OR gate for comparing an output from the inverter and an inputted address.

7. The fuse repair circuit for the semiconductor memory device according to claim 6, wherein row redundancy information is programmed in the first fuse and column redundancy information is programmed in the second fuse.

8. The fuse repair circuit for the semiconductor memory device according to claim 6, wherein a gate of the first PMOS transistor receives a precharge signal and gates of the first and second NMOS transistors receive the first and second switching signals, respectively.

9. The fuse repair circuit for the semiconductor memory device according to claim 8, wherein the precharge signal is activated when the RAS and CAS signals are transited, the first switching signal is activated for a predetermined interval after the transition of the RAS signal and the second switching signal is activated for a predetermined interval after the transition of the CAS signal.

10. The fuse repair circuit for the semiconductor memory device according to claim 1, wherein the redundancy driving unit comprises:
    a NOR gate for NORing compare signals outputted from the fuse units and thereby outputting a matching signal for the column redundancy;
    a transmission gate for transmitting an output from the NOR gate in accordance with the first switching signal;
    a latch for latching an output from the transmission gate; and
    an inverter for inverting an output from the latch for thereby outputting a matching signal for the row redundancy.

11. A fuse repair circuit for a semiconductor memory device, comprising:
    a cell array which includes a row redundancy and a column redundancy; and
    a fuse block for driving the row redundancy and the column redundancy in accordance with an operational cycle of the cell array, wherein the fuse block consists of an address input unit for outputting a row address or a column address in accordance with first and second switching signals;
    a plurality of fuse units programmed with redundancy information of a defective cell for comparing an address outputted from the address input unit with the programmed redundancy information; and a redundancy driving unit for receiving signals outputted from the fuse units and outputting matching signals for driving the row redundancy and the column redundancy.

12. The fuse repair circuit for the semiconductor memory device according to claim 11, wherein the fuse block drives the row redundancy during a RAS cycle and drives the column redundancy during a CAS cycle.

13. The fuse repair circuit for the semiconductor memory device according to claim 11, wherein the programmed redundancy information is a row address or a column address of the defective cell.

14. The fuse repair circuit for the semiconductor memory device according to claim 11, wherein the first switching signal is activated during a predetermined interval after the transition of a RAS signal and the second switching signal is activated during a predetermined interval after the transition of a CAS signal.

15. The fuse repair circuit for the semiconductor memory device according to claim 14, wherein row redundancy information is programmed in the first fuse and column redundancy information is programmed in the second fuse.

16. The fuse repair circuit for the semiconductor memory device according to claim 11, wherein each of the fuse units comprises:

first and second PMOS transistors which are connected in parallel between a source voltage and a first node;

a first NMOS transistor and a first fuse which are serially connected between the first node and ground;

a second NMOS transistor and a second fuse which are serially connected between the first node and the ground;

an inverter connected between the first node and a gate of the second PMOS transistor; and an exclusive-OR gate for comparing an output from the inverter and an inputted address.

17. The fuse repair circuit for the semiconductor memory device according to claim 16, wherein a gate of the first PMOS transistor receives a precharge signal and gates of the first and second NMOS transistors receive the first and second switching signals, respectively, the precharge signal being activated when the RAS and CAS signals are transited.

18. The fuse repair circuit for the semiconductor memory device according to claim 11, wherein the redundancy driving unit comprises:

a NOR gate for NORing compare signals outputted from the fuse units for thereby outputting a matching signal for the column redundancy;

a transmission gate for transmitting an output from the NOR gate in accordance with the first switching signal;

a latch for latching an output from the transmission gate; and an inverter for inverting an output from the latch for thereby outputting a matching signal for the row redundancy.

* * * * *